US011647579B2

(12) United States Patent
Zhou et al.

(10) Patent No.: US 11,647,579 B2
(45) Date of Patent: May 9, 2023

(54) CHIP-ON-CHIP POWER DEVICES EMBEDDED IN PCB AND COOLING SYSTEMS INCORPORATING THE SAME

(71) Applicant: TOYOTA MOTOR ENGINEERING & MANUFACTURING NORTH AMERICA, INC., Plano, TX (US)

(72) Inventors: Feng Zhou, Ann Arbor, MI (US); Hiroshi Ukegawa, South Lyon, MI (US); Ercan Mehmet Dede, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 166 days.

(21) Appl. No.: 17/307,405

(22) Filed: May 4, 2021

(65) Prior Publication Data
US 2022/0361315 A1 Nov. 10, 2022

(51) Int. Cl.
*H05K 1/02* (2006.01)
*H05K 1/18* (2006.01)
*H05K 7/20* (2006.01)

(52) U.S. Cl.
CPC .......... *H05K 1/0203* (2013.01); *H05K 1/181* (2013.01); *H05K 7/20336* (2013.01); *H05K 7/20936* (2013.01); *H05K 2201/064* (2013.01); *H05K 2201/10515* (2013.01)

(58) Field of Classification Search
CPC ...... H05K 1/185; H05K 1/181; H05K 1/0272; H05K 1/0203; H05K 7/20336; H05K 7/20936; H05K 2201/064; H05K 2201/10515; H05K 1/115; H05K 3/4697; H05K 3/4644; H05K 1/186
See application file for complete search history.

(56) References Cited

U.S. PATENT DOCUMENTS

| 7,626,261 | B2 | 12/2009 | Baek et al. |
| 9,405,335 | B1 * | 8/2016 | Boilard ................... G06F 1/203 |
| 10,321,613 | B2 | 6/2019 | Tang et al. |
| 10,356,891 | B2 * | 7/2019 | Kim ..................... H05K 3/4644 |
| 2010/0148356 | A1 | 6/2010 | Tamaki |

(Continued)

FOREIGN PATENT DOCUMENTS

| CN | 202535633 U | 11/2012 |
| CN | 108601200 A | 9/2018 |

(Continued)

OTHER PUBLICATIONS

Yang et al., PCB Embedded Chip-on-Chip Packaging of a 48 kW SiC MOSFET DC-AC Module with Double-Side Cooling Design, https://ieeexplore.ieee.org/document/9161737, Aug. 7, 2020.

*Primary Examiner* — Adam B Dravininkas
(74) *Attorney, Agent, or Firm* — Dinsmore & Shohl LLP

(57) ABSTRACT

Printed circuit board (PCB) substrates include at least one pre-preg layer interposed between one or more electrically conductive layers, power device stacks, each having a power device embedded within the PCB substrate in a vertical stack configuration, and a flat heat pipe positioned between the power device stacks within the at least one pre-preg layer, one surface of the flat heat pipe directly bonded to a first one of the power device stacks and an opposite surface of the flat heat pipe thermally coupled to a second one of the power device stacks.

20 Claims, 13 Drawing Sheets

(56) References Cited

U.S. PATENT DOCUMENTS

| | | | |
|---|---|---|---|
| 2014/0060780 A1* | 3/2014 | Moon | F28D 15/046 29/890.032 |
| 2015/0354901 A1* | 12/2015 | Moore | F28D 15/04 165/104.21 |
| 2020/0176349 A1 | 6/2020 | Hsu et al. | |
| 2020/0357721 A1* | 11/2020 | Sankman | H01L 23/3157 |
| 2020/0359531 A1* | 11/2020 | Basu | F28D 15/0283 |
| 2021/0014963 A1* | 1/2021 | Tain | H05K 1/0272 |
| 2022/0053634 A1* | 2/2022 | Zhou | H05K 7/20336 |
| 2022/0065549 A1* | 3/2022 | Zhou | F28D 15/046 |
| 2022/0141951 A1* | 5/2022 | Zhou | H05K 1/0203 361/700 |

FOREIGN PATENT DOCUMENTS

| | | |
|---|---|---|
| EP | 3216325 A1 | 9/2017 |
| JP | 09283677 A | 10/1997 |

* cited by examiner

CHIP-ON-CHIP POWER DEVICES EMBEDDED IN PCB AND COOLING SYSTEMS INCORPORATING THE SAME

TECHNICAL FIELD

The present disclosure generally relates to heat transfer components and, more specifically, to chip-on-chip PCB stacks having embedded heat pipes positioned between the chips to facilitate the extraction of heat within the chip-on-chip PCB stack.

BACKGROUND

Power control units (PCUs) include power cards having power devices, cooling device(s), gate drivers, printed circuit board (PCB), capacitors, and other components. A component of the PCU is a power card, which contains power devices that may be switched on and off in high frequency during operation of a vehicle, for example. These power devices may generate significant amounts of heat. Conventional power cards are designed to expose surface area of the power devices for cooling purposes. Some PCU configurations include power cards that are sandwiched within liquid cooled units to maintain a proper temperature while they are switching on and off, because switching generates heat. Furthermore, the power cards are connected to the driver board through pin connections. Such power cards may be mounted to a driver board via pins and may extend a distance from the driver board, leading to a larger volume profile, which includes a small power density and a high system loop inductance, resulting in a high power loss, especially at high switching frequencies. Improvements within the PCU structure are desirable to improve the power density and cooling of the PCU.

SUMMARY

In one aspect, a printed circuit board (PCB) substrate includes at least one pre-preg layer interposed between one or more electrically conductive layers, power device stacks, each having a power device embedded within the PCB substrate in a vertical stack configuration, and a flat heat pipe positioned between the power device stacks within the at least one pre-preg layer, one surface of the flat heat pipe directly bonded to a first one of the power device stacks and an opposite surface of the flat heat pipe thermally coupled to a second one of the power device stacks.

In another aspect, an embedded cooling system includes a printed circuit board (PCB) substrate having electrically conductive layers and at least one pre-preg layer interposed between the electrically conductive layers, power device stacks, each having a power device embedded within the PCB substrate in a vertical stack configuration, a flat heat pipe having an evaporator end and a condenser end opposite the evaporator end, the evaporator end positioned between the power device stacks within the at least one pre-preg layer, a top surface of the evaporator end directly bonded to a first one of the power device stacks and thermally coupled to a second one of the power device stacks on a bottom surface of the evaporator end of the flat heat pipe, a thermally conductive via comprising a first end and a second end opposite the first end, the first end extending from a surface of the PCB substrate to the condenser end of the flat heat pipe and coupled to the flat heat pipe, and a cold plate thermally coupled to the second end of the thermally conductive via.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
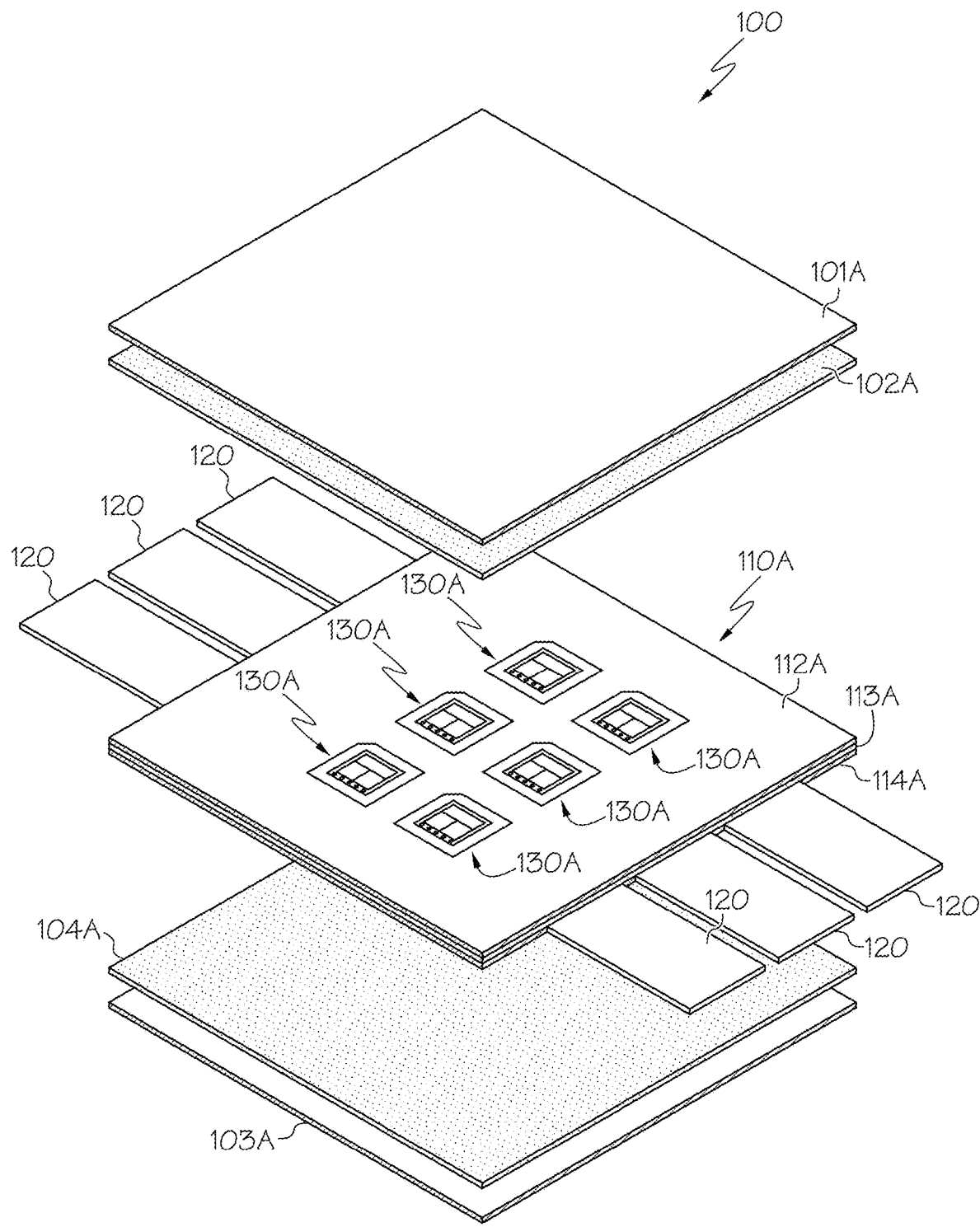
FIG. 1 schematically depicts an exploded perspective view of an illustrative embedded cooling system including a printed circuit board (PCB) substrate with a plurality of embedded power devices and a plurality of embedded flat heat pipes according to one or more embodiments shown and described herein.

The devices described herein generally relate to embedded cooling systems that include power devices (e.g., embedded power semiconductor devices) and flat heat pipes embedded within substrates such as gate driver printed circuit boards (PCBs). Embodiments are directed to chip-on-chip PCB stacks (e.g., vertically stacked power devices embedded within a PCB) having embedded flat heat pipes positioned between the power devices to improve the extraction of heat from within the chip-on-chip PCB stack. Implementations of the flat heat pipe as a cooling structure within the chip-on-chip PCB stack enables the entire power electronics unit to have an increased power density and lower cost as compared to configurations where the chips are oriented in parallel (e.g., across a single planar PCB).

The embedded power devices shown and described herein utilize copper layers, pre-impregnated (e.g., "pre-preg") layers, and/or copper vias to form an inverter topology, a convertor topology, or a similar topology. Various configurations are shown and described herein. One or more of the copper layers and/or pre-preg layers may be formed to receive the embedded heat pipes, which are configured to extend from the copper layer(s) to a location outside of the substrate, the location having a cooling assembly (e.g., a condenser) to facilitate heat transfer.

Each structure shown and described herein provides advantages over traditional topologies (e.g., surface mounted power device topologies) because of the location and configuration of particular components. For example, the power device embedded substrates described herein provide smaller system volumes, lighter system weights, higher system power densities (e.g., power modules that include power device embedded PCBs are configured to operate at 40 kilowatts (kW) or more), lower overall inductances that deliver smaller switching losses, particularly at high switching frequency, overall lower cost, and/or more easily fits into new and unique locations within a vehicle (e.g., within wheels or the like).

Furthermore, embodiments described herein propose various embedded power semiconductor devices within a substrate. The topologies further provide improved cooling of the system by reducing and/or eliminating thermal resistance layers between the power semiconductor devices positioned in a vertical stacked arrangement and coolers such as vapor chambers and/or cold plates. By doing so, the device can maintain lower running temperatures with the same cooler performance or run at a higher power output as heat may be removed more efficiently compared to embedded power semiconductor devices within a substrate that do not have embedded cooling systems described herein. Embodiments shown and described herein reduce and/or eliminate the external electrical isolation layer (and grease layer) and provide a more direct and improved thermal conductive path for removing heat from a power semiconductor device.

Some configurations include a PCB having power devices embedded therein. The power devices may be bonded to copper substrates. In some embodiments, because of the need to electrically couple one or more conductive power layers from one or more surfaces of the power device, the power devices must be electrically isolated outside of the PCB, which reduces the thermal conductivity of the power control unit. Furthermore, in a chip-on-chip stack configuration (e.g., a vertical alignment of one or more power devices within a PCB), it is difficult to provide cooling between the devices. Embodiments described herein provide solutions in the form of embedded flat heat pipes that may be formed among and around electrical vias interconnecting the power devices.

In general, traditional power device embedded PCB configurations utilize the electrical conductive properties of the copper substrates to connect to the power devices across a single planner power card structure wherein two or more devices are situated adjacent to each other on a single surface. However, more electrically beneficial configurations such as the chip-on-chip stack configuration provide small inductances and small switching losses, but pose challenges to inter device cooling.

Additionally, traditional power device embedded PCB configurations connect an electrical insulation layer via one or more grease layers to a cold plate and optionally another electronic device such as a power capacitor that needs to be cooled. Other traditional embodiments connect an electrical insulation layer via one or more grease layers to a vapor chamber and/or a cold plate and optionally another electronic device such as a power capacitor that needs to be cooled.

As will be described in more detail herein, embodiments implement a flat heat pipe to the chip-on-chip structure to provide extra cooling from the center of the stack, which means 3 or more sided cooling for the chip-on-chip stack configuration.

For example, some embodiments implement a direct bonded insulation device such as a direct bonded copper substrate, a direct bonded aluminum device, or an active metal bonding substrate to a first power semiconductor device at a first surface and directly to a flat heat pipe at a second surface opposite the first surface, and a second power semiconductor device is directly bonded or thermally coupled via thermal vias to the opposite side of the flat heat pipe. The flat heat pipe is thereby interposed with the first power semiconductor device and second power semiconductor device and at least partially embedded within the substrate and thermally coupled to a condenser that is located outside the substrate (e.g., the PCB).

Turning now to the drawings wherein like numbers refer to like structures, and particularly to FIG. 1, an exploded perspective view of an illustrative embedded cooling system including a 4-layer printed circuit board (PCB) substrate with a plurality of embedded power devices and a plurality of embedded flat heat pipes is schematically depicted. In general, the PCB substrate 100 includes a plurality of conductive substrate layers 101A, 112A, 114A, and 103A such as copper, gold, silver, aluminum or an alloy thereof interspersed by pre-preg layers 102A, 113A, and 104A, respectively. The plurality of conductive substrate layers 101A, 112A, 114A and 103A and pre-preg layers 102A, 113A, and 104A may be laminated together. Processes such as etching, milling, laser drilling, and the like may be implemented to create electrical connections within a substrate layer, vias between substrate layers, recesses for receiving embedded components such as flat heat pipes 120 and power devices or power device stacks 130A.

As depicted in FIG. 1, the embedded cooling system is integrated within the power embedded PCB substrate 110A of the PCB substrate 100. The power embedded PCB substrate 110A includes a first major substrate 112A (e.g., a top surface, facing the +Y direction of the coordinate axes of FIG. 1) opposite a second major substrate 114A (e.g., a bottom surface, facing the −Y direction of the coordinate axes of FIG. 1) and a pre-preg layer 113A disposed between the first major substrate and the second major substrate. One or more flat heat pipes 120 are positioned within the pre-preg layer 113A. Additionally, one or more power device stacks 130A are thermally coupled to the one or more flat heat pipes 120 and further disposed within the power embedded PCB substrate 110A. In some embodiments, additional conductive substrate layers 101A and 103A and pre-preg layers 102A and 104A laminated to the power embedded PCB substrate 110A. The additional substrate layers may be one or more power conductive layers for electrically coupling to the one or more power devices of the one or more power device stacks 130A. Moreover, in some embodiments, the additional substrate layers may include one or more active or passive components electrically coupled thereto. Illustrative embodiments of the embedded cooling system will be described in more detail herein. Embodiments of the PCB substrate 100 include power device stacks 130A configured in chip-on-chip vertically stacked configurations.

Embodiments of the present disclosure contemplate the implementation of flat heat pipes 120 for extracting heat between vertically stacked a power device stacks 130A embedded within a PCB substrate 100. In particular, embedded flat heat pipes 120 provide a more direct means of removing heat from PCB substrates 100 between power devices to cooling systems external to the PCB substrate 100. While flat heat pipes 120 are disclosed herein, other sizes, shapes, and types of heat pipes may also be implemented without departing from the scope of the present disclosure.

Figure 2:
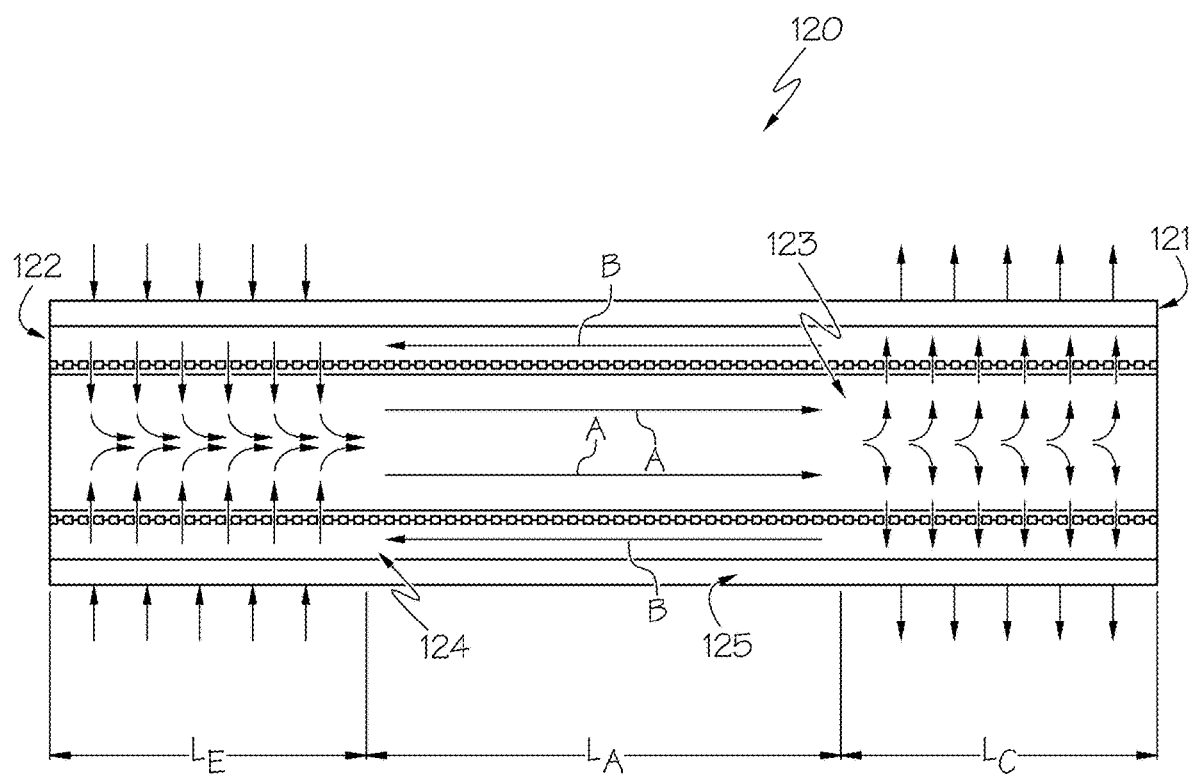
FIG. 2 depicts a cross-sectional side view of an illustrative flat heat pipe according to one or more embodiments shown and described herein.

FIG. 2 depicts a cross-sectional side view of an illustrative flat heat pipe 120 and schematically depicts vapor, liquid, and heat flows during the flat heat pipe 120. While the particular structure of a flat heat pipe 120 may vary, in general, a flat heat pipe 120 includes an outer casing (e.g., comprising a top surface 121 and a bottom surface 125) which are formed to mate with each other along their outer edges to form an enclosure defining a void space 123 therein. The inner surface of the outer casing may include porous media 122, 124 sintered to the inner wall and charged with a liquid. The outer casing of a flat heat pipe 120 may be constructed from copper, aluminum, silver, gold, or other thermally conductive material. Furthermore, the porous media 122, 124 may be sinter metal particles such as copper, aluminum, gold, silver, or other thermally conductive material.

Fabricated flat heat pipes 120 may have a thickness of about 1 mm. As discussed above, the flat heat pipe 120 could be made of copper or aluminum or a similar thermally conductive material. If the flat heat pipe 120 is made of aluminum, then the flat heat pipe 120 may be plated with copper in order to be compatible with a PCB fabrication process using copper as the conductive substrate layers.

The length of the flat heat pipe 120 may be defined by three portions, each having a different function. A first end, $L_E$, (e.g., an evaporator end) which may also be referred to as an evaporator length, receives heat from a thermally coupled heat source such as a power device stack 130A. The heat causes the liquid within the porous media 122, 124 to vaporize and flow within the void space 123 (e.g., as indicated by Arrows A), through a middle portion, $L_A$, to a second end, $L_C$, (e.g., a condenser end) which may also be referred to as a condenser length. As the vapor moves away from the source of heat, the vapor may begin to condense. The vapor may condense at the second end, $L_C$, and be transferred back in to the porous media 122, 124. The porous media 122, 124 may act as a conduit that allows the liquid to return to the first end, $L_E$, through the middle portion, $L_A$, as indicated, for example, by Arrows B. The vapor-liquid-vapor cycle within the flat heat pipe 120 promotes heat transfer from the source of heat received at a first end, $L_E$, to be expelled at the second end, $L_C$. In embodiments, the second end, $L_C$, may be further coupled to an external cooling system that may further increase the condensing operation of the vapor to liquid and removal of heat from the flat heat pipe 120.

Figure 3:
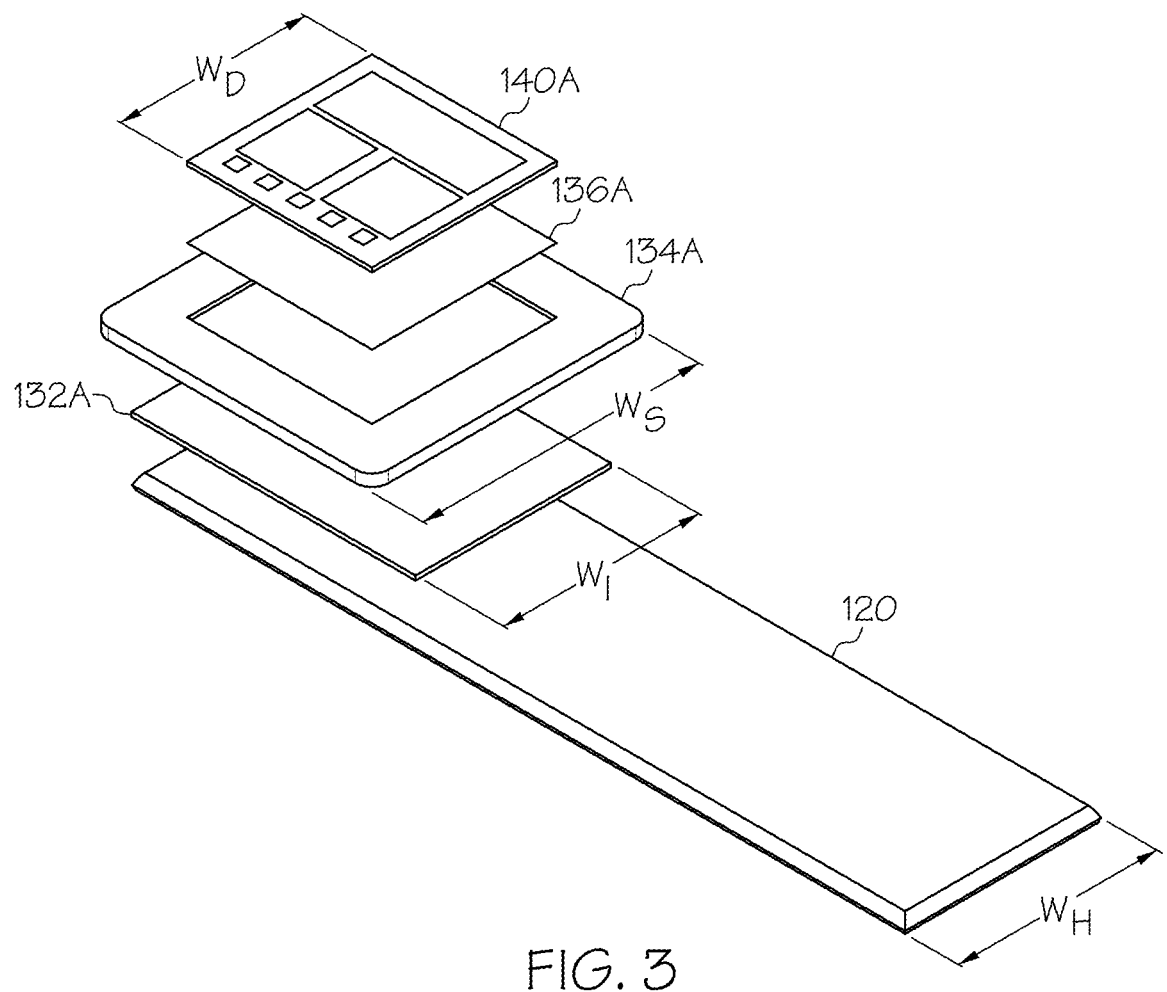
FIG. 3 depicts an exploded perspective view of illustrative power device stack coupled to a flat heat pipe according to one or more embodiments shown and described herein.

Turning to FIG. 3, an exploded side view of the one or more power device stacks 130A that may be coupled to a first end of the flat heat pipes 120 is depicted. The power devices 140A may be bonded to a substrate 134A (e.g., a copper substrate) using silver sintering 136A or other bonding techniques such as TLP bonding or the like.

The power devices 140 and any others depicted and described herein may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices 140 (e.g., power devices 140A or 140B) may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the plurality of power devices 140 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module (including the power devices 140A and 140B).

Conventional power modules including embedded power devices 140 cannot handle the heat generated by high power semiconductor devices because the thermal conductance paths from the power semiconductor device to cooling devices have undesirable thermal resistances. These thermal resistances are the result of small isolated paths such as vias used for electrical power delivery, which are configured between one or more conductive layers that prohibit the ability for more direct bonding of a cold plate to a direct bonding layer and thus a low thermal resistance path. In contrast, embodiments of the present disclosure utilize the flat heat pipes 120 directly bonded to the power device stacks 130A coupled to the power devices 140A. Such a configuration allows for more efficient and effective heat transfer from the power modules including the power devices 140A, as described herein. The plurality of power devices 140A may be controlled by a gate drive device (e.g., driver circuit components 155, FIG. 10) in the power embedded PCB substrate 110A to change a current type between an alternating current to a direct current, for example.

Still referring to FIG. 3, the substrate 134A is further bonded to the flat heat pipe 120. The power device 140A may be bonded to the substrate 134A on the first surface thereof. In some embodiments, the substrate 134A may include a cavity in the first surface that is sized and shaped to receive one or more of the power devices 140A to provide a close mating between the power devices 140A and the substrate 134A. However, this is not a requirement as the power devices 140A may be bonded to the substrate 134A. In some embodiments, the substrate 134A is further bonded to the flat heat pipe 120 via an electrical insulation layer 132A. The electrical insulation layer 132A could be similar to what is used in an IMS substrate, where the dielectric serves as medium for the thermal conduction, but also for electrical insulation purposes as well as for bonding copper to copper. In some embodiments, a ceramic layer could be used to direct bond the substrate 134A to the aluminum substrate of the flat heat pipe 120, which is similar to direct bonded copper (DBC) or direct bonded aluminum (DBA) substrates, or active metal braze (AMB) substrate. The ceramic dielectric layer could be Alumina ($Al_2O_3$), Aluminum nitride (AlN), Beryllium oxide (BeO), or the like. That is, the power device stack 130A may be electrically isolated from the flat heat pipe 120 via an electrical insulation layer 132A, however, in other embodiments, the power device stack 130A may be bonded to the flat heat pipe 120 without an electrical insulation layer 132A.

In some embodiments, the width $W_H$ of the flat heat pipe 120 is less than the width $W_S$ of the substrate 134A and/or the width W of the electrical insulation layer 132A. The width $W_H$ of the flat heat pipe 120 is equal to or greater than the width $W_D$ of the power device 140A. In configurations where the width $W_H$ of the flat heat pipe 120 is less than the width $W_S$ of the substrate 134A, as depicted and described in more detail herein, the portion of the substrate 134A that is not bonded to the flat heat pipe 120 may be used for direct electrical connection to a plurality of electrical vias between a first and second power device stack configured in a chip-to-chip vertical configuration. In other embodiments, the evaporator end of the flat heat pipe 120 may have a U-shaped configuration as depicted and described with reference to FIGS. 9A-9D.

Figure 4:
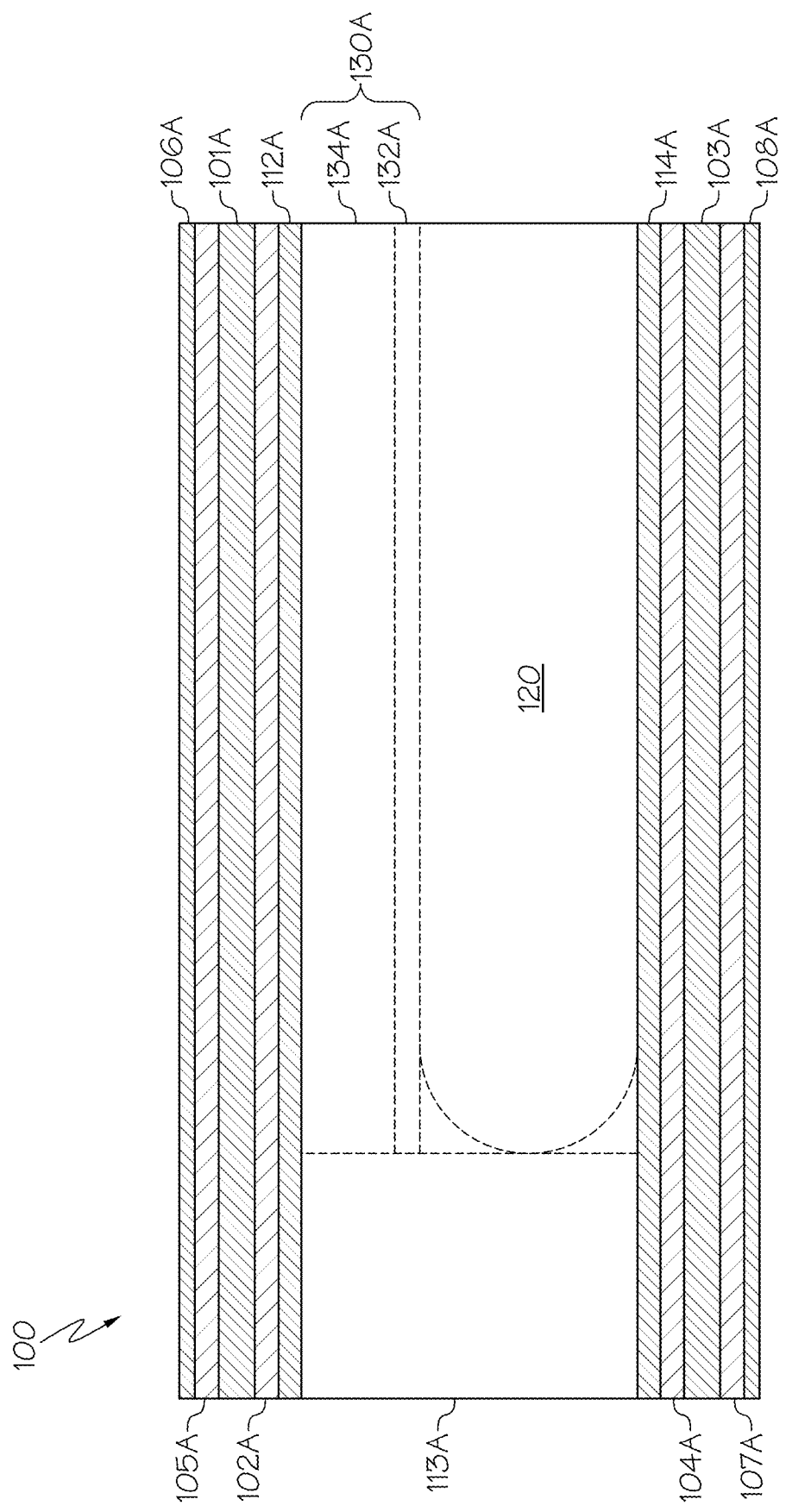
FIG. 4 depicts a cross-sectional side view of an illustrative multi-layer PCB substrate according to one or more embodiments shown and described herein.

Before turning to detailed embodiments of the present disclosure, a brief discussion of a PCB substrate is provided. FIG. 4 depicts a cross-sectional side view of an illustrative multi-layer PCB substrate 100 having an embedded power device stack 130A and embedded flat heat pipe 120 according to one or more embodiments shown and described herein. It is understood that the elements are not drawn to scale. In general, PCB substrates 100 include multiple layers laminated to each other. For example, the layers may include conductive substrate layers 101A, 103A, 106A, 108A, 112A, and 114A and electrical insulating layers 102A, 104A, 105A, 107A, and 113A (also referred to herein as pre-preg layers) disposed between the conductive substrate layers 101A, 103A, 106A, 108A, 112A, and 114A. In some embodiments, insulating layers may be formed in one or multiple layers. For example, pre-preg layer 113A may be formed in two separate layers such that devices or other components may be embedded within the pre-preg layers. The pre-preg layers may include one or more embedded conductive traces and or conductive vias thermally or electrically coupling elements or conductive layers to each other.

The conductive substrate layers may be made of copper, aluminum, gold, silver, metal alloys thereof and other electrically conductive materials. The electrical insulating layers 102A, 104A, 105A, 107A, and 113A may be laminates also known as pre-preg materials. For example, such materials may include cloth or fiber material combined with a resin material, where the cloth to resin ratio determines the laminate's type designation (e.g., FR-4, CEM-1, G-10, etc.) and therefore the characteristics of the laminate produced. A variety of materials having dielectric properties include polytetrafluoroethylene (Teflon), FR-4, FR-1, CEM-1 or CEM-3. Other pre-preg materials used in the PCB industry are FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester).

As shown in FIG. 4, the flat heat pipe 120 is positioned within the pre-preg layer 113A and thermally coupled to the power device stack 130A also embedded therein. In some embodiments, the conductive layer 112A may be an N lead frame that couples to the N power terminal of the first power device 140A in the first power device stack 130A. Furthermore, the conductive layer 114A may be an O lead frame that is further connected to another power device stack (not shown in FIG. 4).

Figure 5:
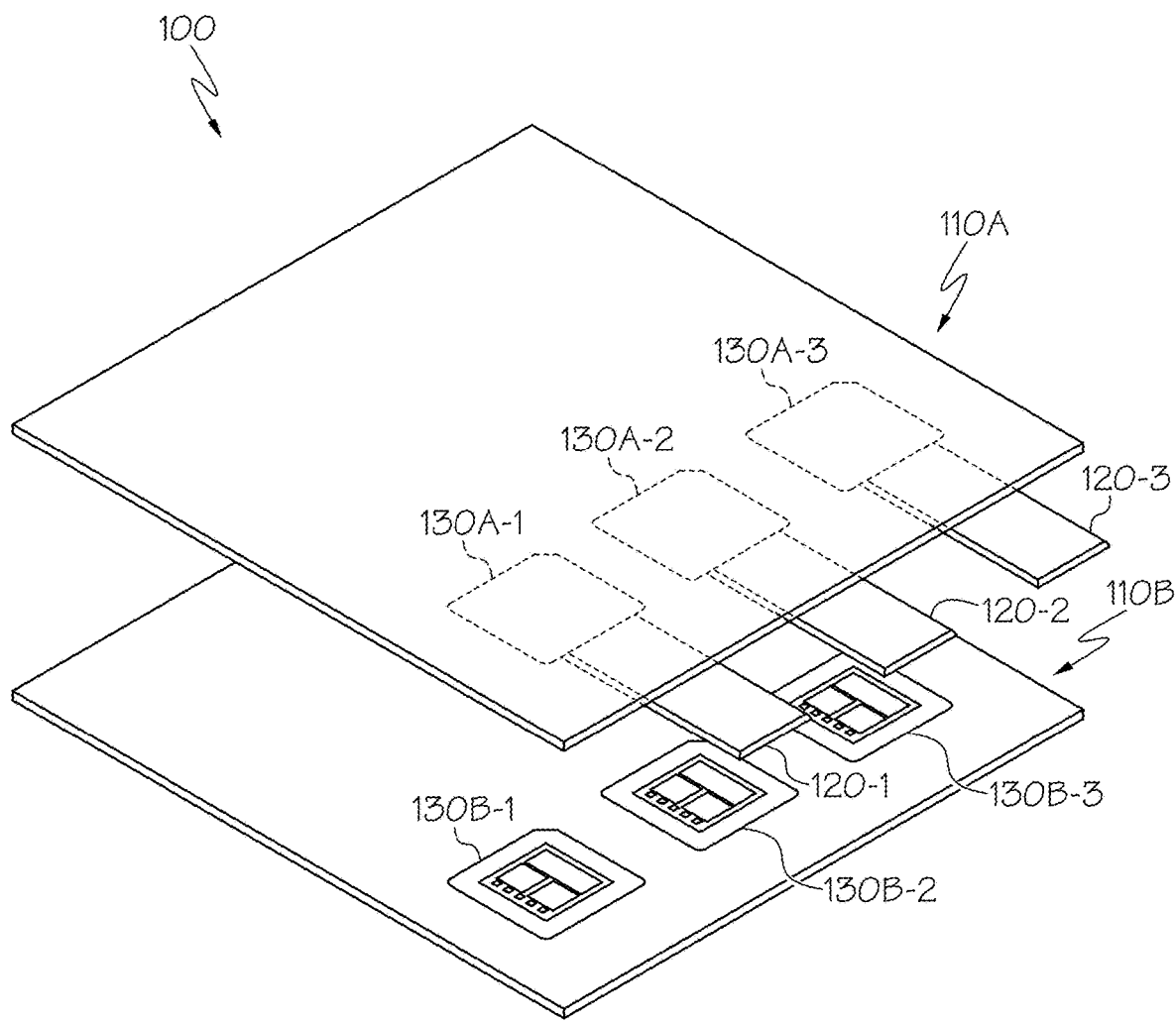
FIG. 5 depicts an exploded perspective view of an illustrative PCB substrate having a first power embedded PCB substrate and a second power embedded PCB substrate in a chip-on-chip vertical configuration with a flat heat pipe positioned between the power device stacks of the first power embedded PCB substrate and the second power embedded PCB substrate according to one or more embodiments shown and described herein.

Turning to FIG. 5, an exploded perspective view of an illustrative PCB substrate 100 having a first power embedded PCB substrate 110A and a second power embedded PCB substrate 110B with a flat heat pipe positioned between the power device stacks 130A and 130B of the first power embedded PCB substrate 110A and the second power embedded PCB substrate 110B is depicted. In embodiments, the first power embedded PCB substrate 110A and the second power embedded PCB substrate 110B may be manufactured separately and then bonded together using known PCB bonding techniques.

The first power embedded PCB substrate 110A may include one or more power device stacks 130A (e.g., 130A-1, 130A-2, 130A-3) positioned therein. The power device stacks 130A are typically arranged in a planar array adjacent each other depending on the power device configuration. For example, the power device may be an inverter, converter, or combination thereof. Thus depending on the application, for example, the power requirements, number of power phases, or the like, a plurality of power devices may be implemented. The PCB substrate 100 (e.g., a power card) further includes a second power embedded PCB substrate 110B. The second power embedded PCB substrate 110B includes one or more power device stacks 130B (e.g., 130B-1, 130B-2, 130B-3) positioned therein. The power device stacks 130B are aligned vertically with their corresponding power device stacks 130A in the first power embedded PCB substrate 110A. Such an alignment forms a chip-on-chip vertically configured PCB substrate. The flat heat pipes 120 (e.g., 120-1, 120-2, 120-3) are positioned between respective pairs of power device stacks 130A in the first power embedded PCB substrate 110A and power device stacks 130B in the second power embedded PCB substrate 110B. The flat heat pipe 120 is positioned in direct thermal contact with at least one of the vertically aligned power device stacks 130A or 130B. The other one of the vertically aligned power device stacks 130A or 130B is thermally coupled to the flat heat pipe through one or more thermally conductive vias or bulk material that provides a thermally conductive path from the power device to the flat heat pipe 120. The flat heat pipe 120 may extend outside the PCB substrate at a condenser end. The condenser end may be coupled to a cold plate or other cooling assembly that removes heat from flat heat pipe 120.

Figure 6:
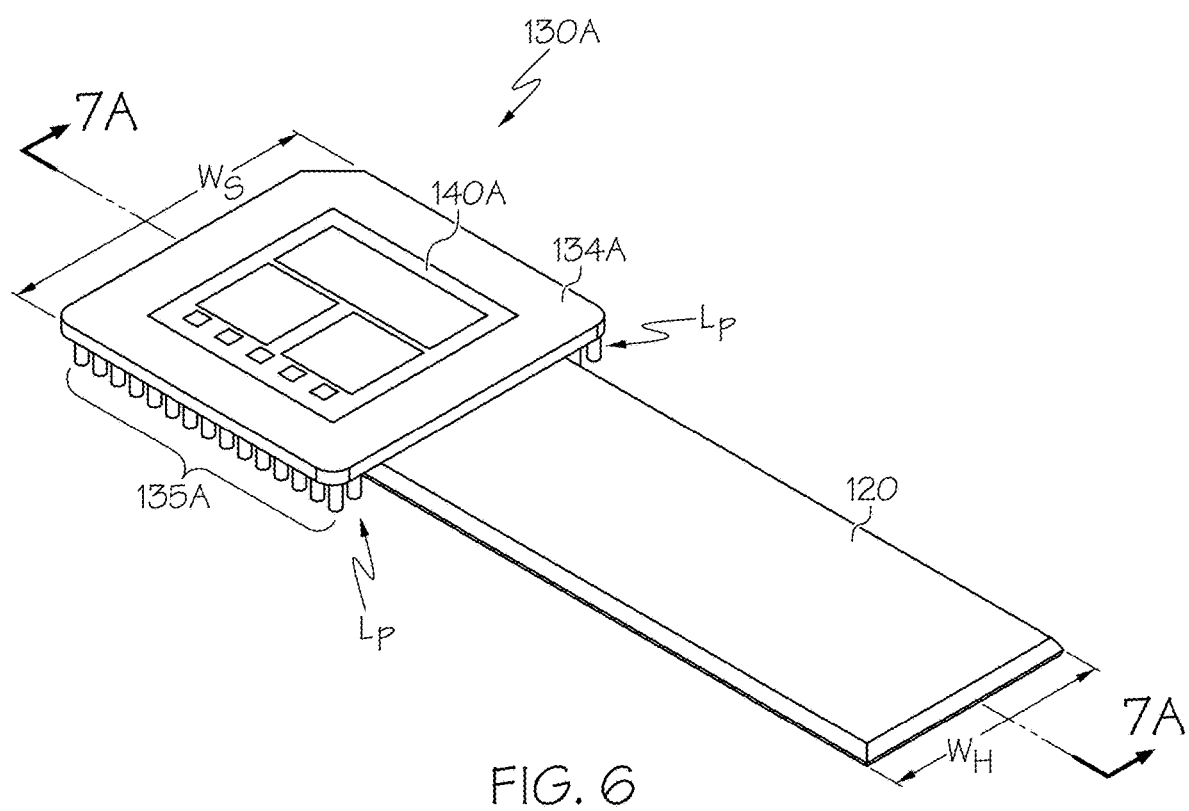
FIG. 6 depicts a perspective view of an embodiment of a flat heat pipe thermally coupled to the power device stack according to one or more embodiments shown and described herein.

Turning now to FIGS. 6, 7A, 7B, and 8, one embodiment of a flat heat pipe 120 thermally coupled to the power device stack 130A is depicted. Referring to FIG. 6, a perspective view of the flat heat pipe 120 having a width $W_H$ that is less than the width $W_S$ of the power device stack 130A is depicted. The difference between the width $W_S$ of the power device stack 130A and the width $W_H$ of the flat heat pipe 120 creates a lengthwise portion $L_P$ (optionally along either sides of the flat hat pipe 120) of the power device stack 130A that extends beyond the width $W_H$ of the flat heat pipe 120. The lengthwise portion $L_P$ provides direct vertical paths for a plurality of vias 135A may be formed or coupled to the substrate 134A of the power device stack 130A and extend downward past the flat heat pipe 120 to electrically couple the power device stack 130A to lower subsequent layers of the PCB substrate 100 such as other power device stacks 130A.

Figure 7A:
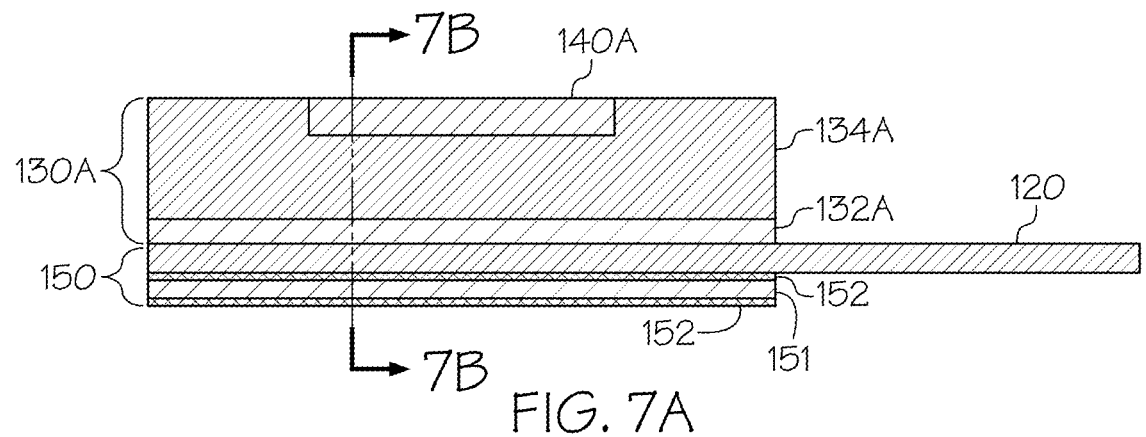
FIG. 7A depicts a cross-sectional view along the length of the flat heat pipe and the power device stack depicted in FIG. 6 according to one or more embodiments shown and described herein.
Figure 7B:
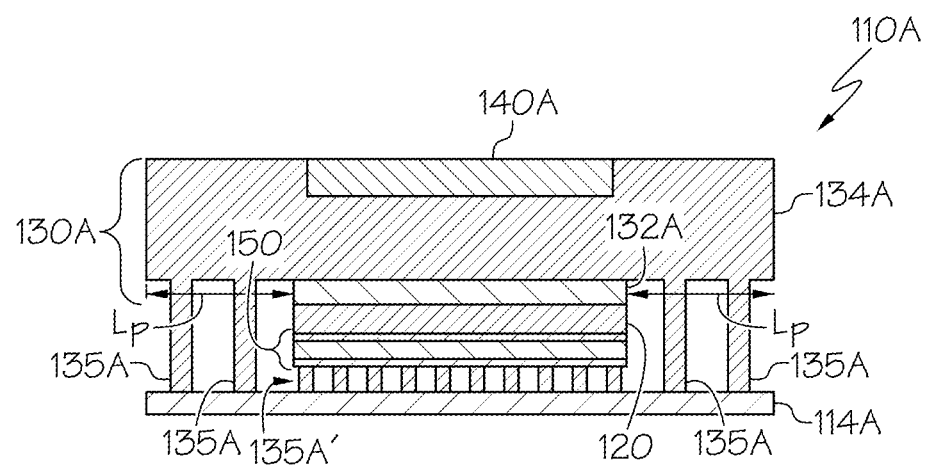
FIG. 7B depicts a cross-sectional view along the width of the flat heat pipe and the power device stack depicted in FIG. 6 according to one or more embodiments shown and described herein.

Referring to FIGS. 7A and 7B, the illustrated flat heat pipe 120 bonded to the power device stack 130A in FIG. 6 is depicted in cross-sectional views with one or more additional layers of the PCB substrate 100. FIG. 7A depicts a cross-sectional view along the length of the flat heat pipe 120 and the power device stack 130A. The power device stack 130A is bonded to the flat heat pipe 120, optionally via an electrical insulation layer 132A. Opposite the bonded power device stack 130A on the flat heat pipe 120 may be a DBC layer 150. The DBC layer 150 includes a ceramic layer 151 positioned between a pair of conductive layers 152 (e.g., copper). The conductive layers 152 enable bonding to the flat heat pipe 120 and further layers of the PCB substrate 100, while the ceramic layer provide electrical insulation.

Turning to FIG. 7B, a cross-sectional view along the width of the flat heat pipe 120 and the power device stack 130A is depicted. In the present cross-sectional view the lengthwise portion $L_P$ is shown. This extended region of the substrate 134A beyond the width $W_H$ of the flat heat pipe 120 provides space for a plurality of vias 135A to directly extend from the power device stack 130A to other power devices and/or layers within the PCB substrate 100. For example, the plurality of vias 135A electrically couples the power device stack 130A to the conductive layer 114A. Additionally, the flat heat pipe 120 may be aligned within the power device 140A of the power device stack 130A so that direct thermal coupling between the flat heat pipe 120 and the power device 140A may be achieved. Furthermore, the DBC layer 150 is provided as an electrical insulation layer to the lower surface of the flat heat pipe 120 while providing a thermally conductive path through a set of vias 135A' from lower layers (e.g., shown in more detail with reference to FIG. 8) to the flat heat pipe 120 so that heat may be removed from within and between power devices in the PCB substrate 100.

Figure 8:
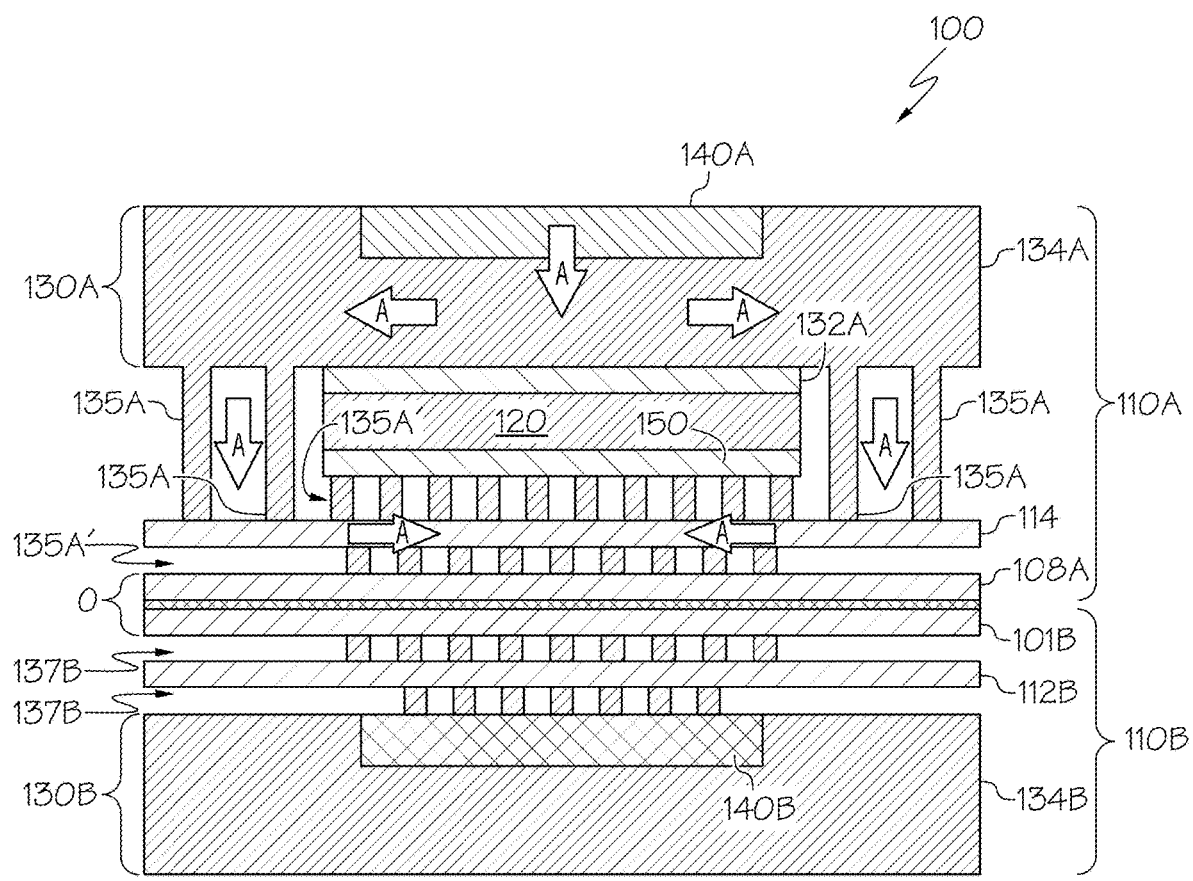
FIG. 8 depicts a cross-sectional view of a PCB substrate according to one or more embodiments shown and described herein.

Turning to FIG. 8, the first power embedded PCB substrate 110A depicted in at least FIG. 7B is bonded to the second power embedded PCB substrate 110B. By way of example but without limitation, the first power device stack 130A includes a first power device 140A, a substrate 134A, and an electrical insulation layer 132A. The first power device stack 130A is directly bonded to the flat heat pipe 120 which has a smaller width than the first power device stack 130A. The direct bonding provides a thermal coupling between the first power device stack 130A to the flat heat pipe 120. Electrical vias 135A are positioned in the lengthwise portion formed by the wider substrate 134A. The vias 135A electrically couple the power device 140A to at least the conductive layer 114 positioned below the flat heat pipe 120. Arrows "A" depict the flow of electricity from the first power device 140A through the vias 135A to the conductive layer 114. The first power embedded PCB substrate 110A may further include one or more additional layers below the conductive layer 114. For example, the conductive layer 114A may further be electrically and thermally coupled to conductive substrate layer 108A through a further set of vias 135A'.

The second power embedded PCB substrate 110B includes one or more conductive substrate layers 101B and 112B interposed with pre-preg layers and electrically and thermally coupled through vias 135A' and 137B, respectively. The second power embedded PCB substrate 110B further includes a second power device stack 130B having a second power device 140B. The second power embedded PCB substrate 110B is bonded to the first power embedded PCB substrate 110A to form a PCB substrate having at least two power devices 140A and 140B configured in a chip-on-chip vertical configuration as shown, for example, in FIG. 8. In some embodiments an N lead frame may be coupled to the first power device 140A, a P lead frame is coupled to the second power device 140B through the substrate 134B and an O lead frame "O" electrically coupled to the first power device 140A through the substrate 134A and the second power device 140B. Such a configuration as shown and described may be implemented to form a half-bridge converter which is a DC-DC type converter.

Figure 10:
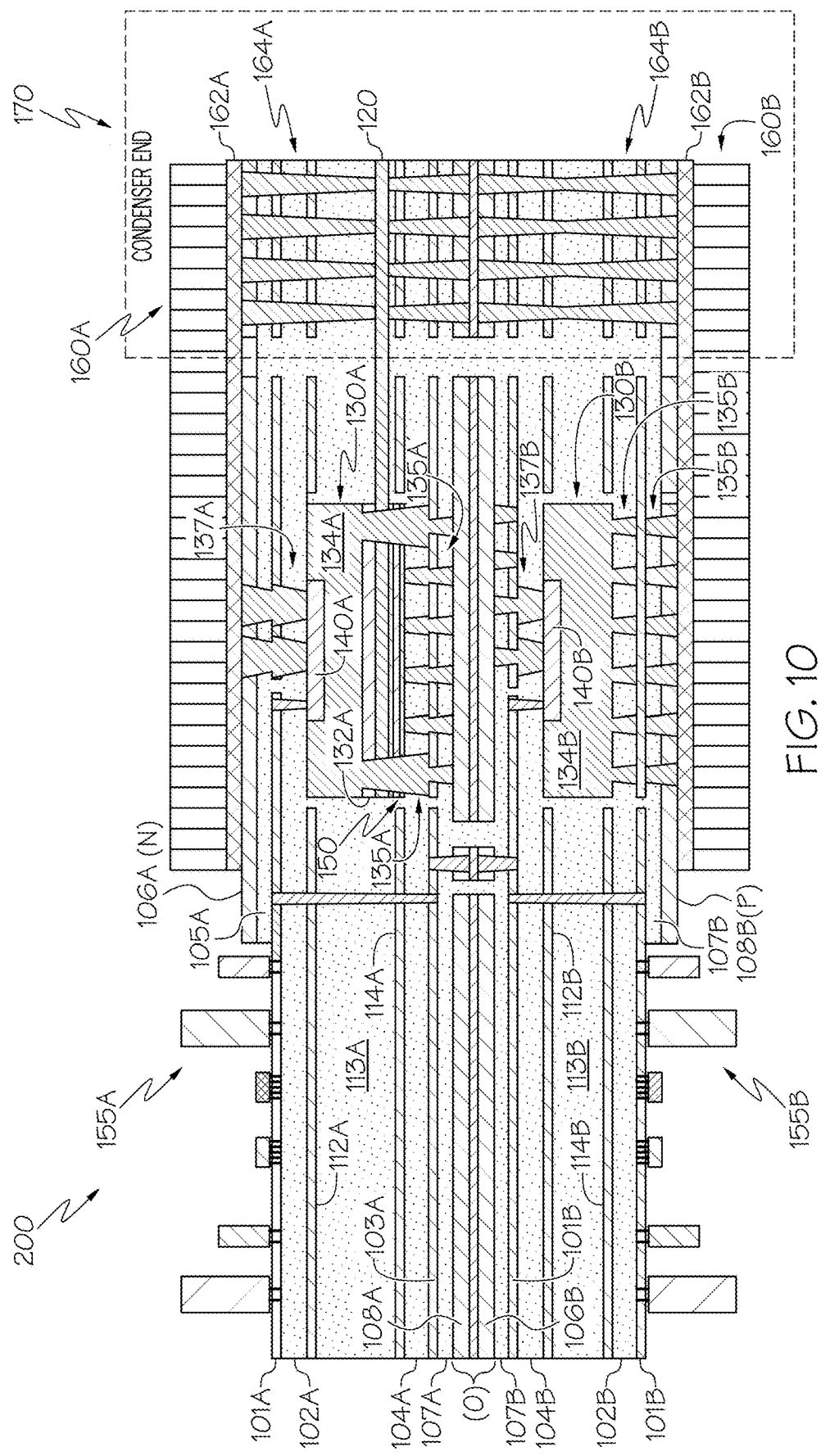
FIG. 10 depicts a cross-sectional view of an illustrative embodiment of an embedded cooling system within a PCB substrate according to one or more embodiments is depicted.

In some embodiments, the one or more power layers (e.g., P, N, O layers) may be formed through lamination, laser drilling, platting, and etching processes. The power layers may form a half-bridge of an inverter using the embedded power devices 140A and 140B as depicted in FIG. 10, for example. This is merely one example electrical system that may be formed within the PCB substrate using processes described herein and including an embedded cooling system implementing flat heat pipes 120 embedded therein. In some embodiments, the embedded power devices shown and described herein may be implemented in an inverter topology, a convertor topology, or a similar topology.

Figure 9A:
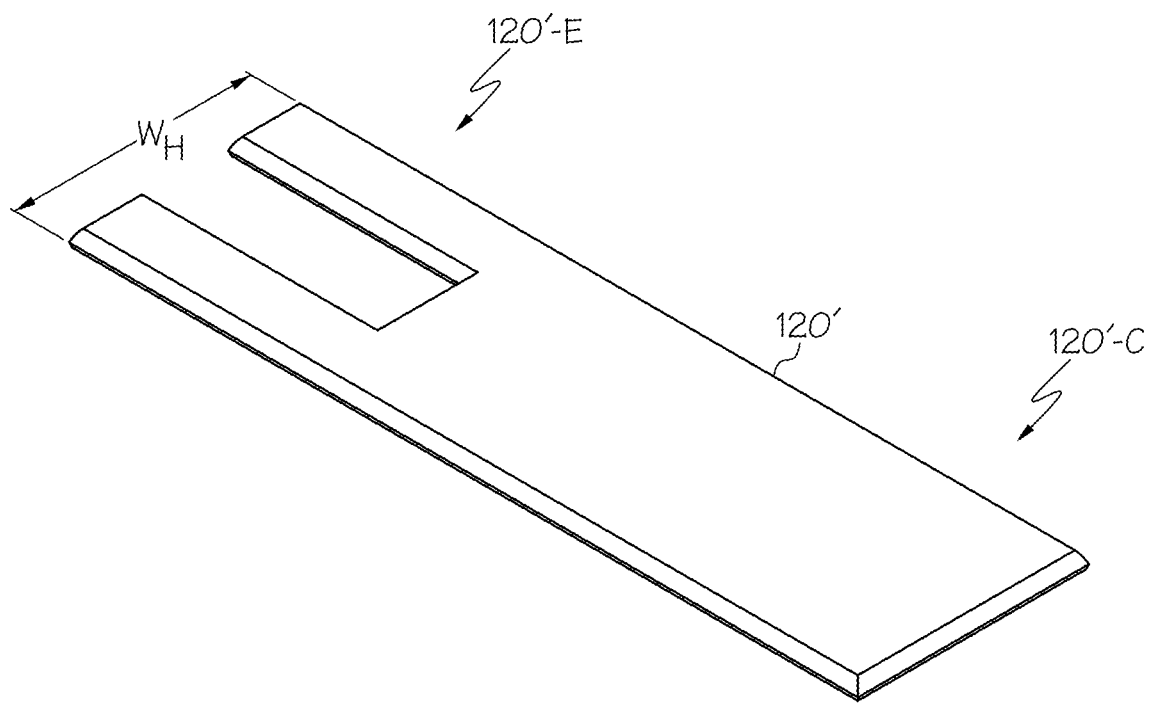
FIG. 9A depicts a top perspective view of a flat heat pipe having a U-shaped evaporator end according to one or more embodiments shown and described herein.
Figure 9B:
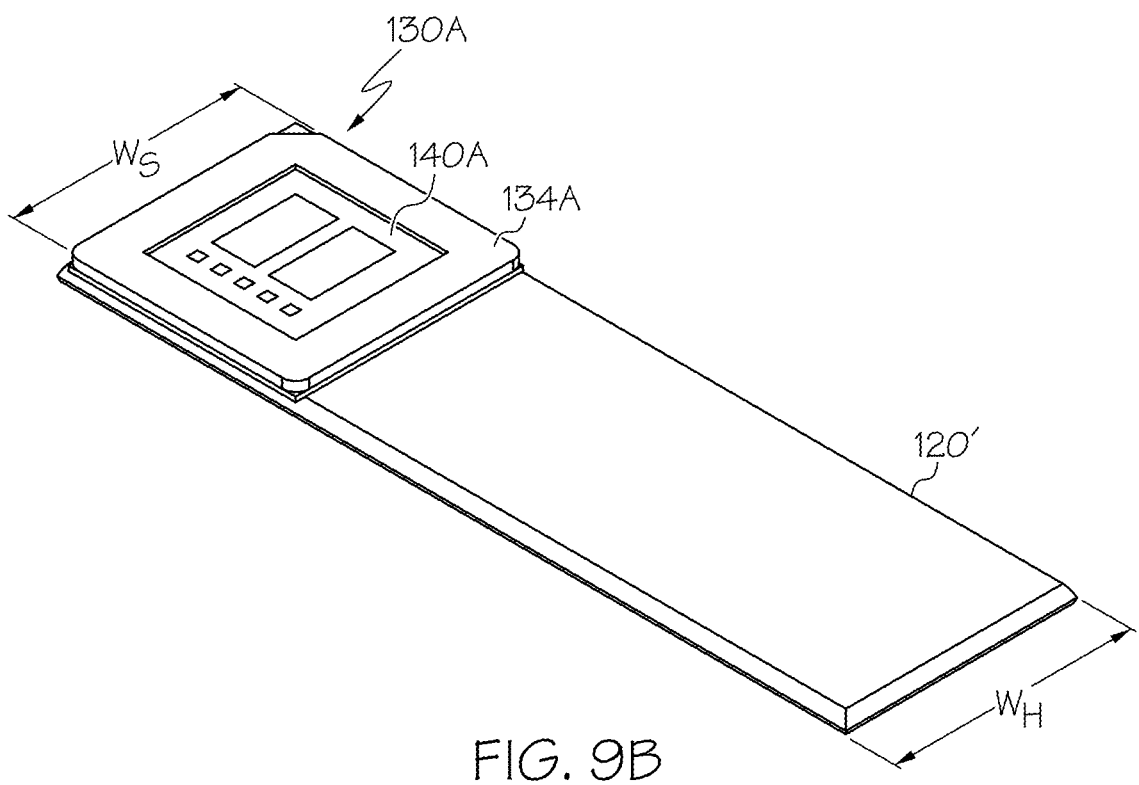
FIG. 9B depicts a top perspective view of a flat heat pipe having a U-shaped evaporator end coupled to a power device stack according to one or more embodiments shown and described herein.

Referring now to FIGS. 9A-9D, another embodiment a flat heat pipe 120' is depicted. Previously described flat heat pipes have a generally rectangular shape extending from the first end (e.g., the evaporator end) 120'-E to the second end (e.g., the condenser end) 120'-C where the width of the heat pipe is varied to provide for various applications of chip-on-chip vertical configurations within the PCB substrate 100. FIG. 9A depicts a top perspective view of a flat heat pipe 120' having a U-shaped evaporator end 120'-E. The U-shaped evaporator end 120'-E provides an opening through the flat heat pipe 120' where vertical electrical connections may be positioned. As depicted in FIG. 9B, the power device stack 130A is bonded to the U-shaped evaporator end 120'-E of the flat heat pipe 120'. The width $W_H$ of the flat heat pipe 120' and the power device stack 130A may be generally the same or in some embodiments the width $W_H$ of the flat heat pipe 120' may be larger or smaller than the width $W_S$ of the substrate 134A of the power device stack 130A.

Figure 9C:
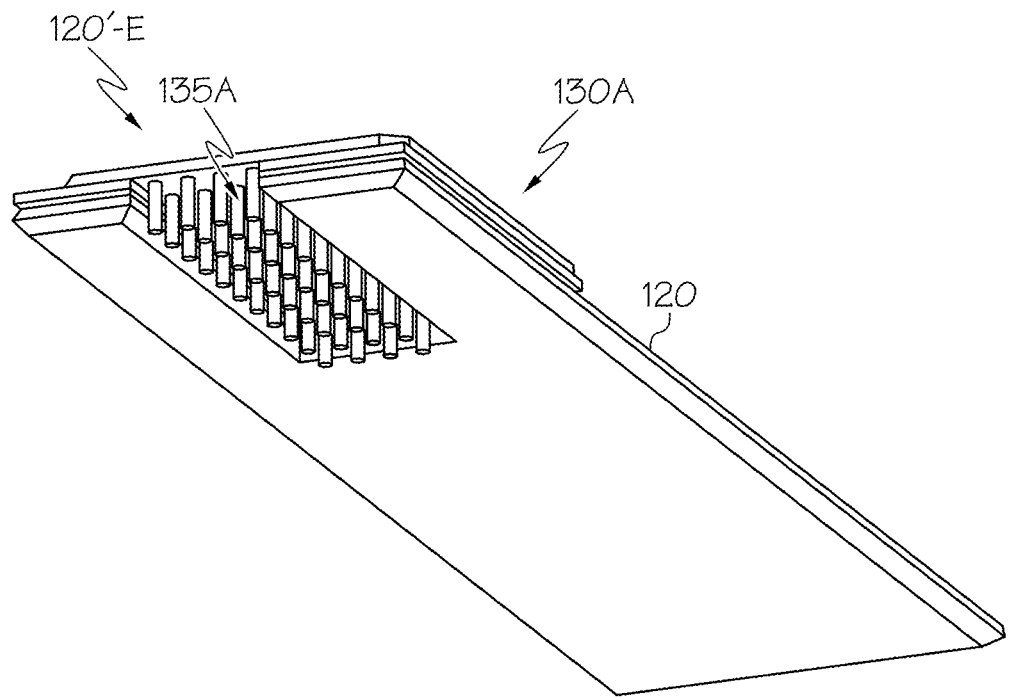
FIG. 9C depicts a bottom perspective view of the flat heat pipe having a U-shaped evaporator end coupled to the power device stack according to one or more embodiments shown and described herein.

FIG. 9C depicts a bottom perspective view of the flat heat pipe 120' having the U-shaped evaporator end 120'-E. The center portion of the U-shaped evaporator end 120'-E of the flat heat pipe 120' defines a cavity through the evaporator end 120'-E of the flat heat pipe 120'. Within the cavity, a plurality of vias 135A may be positioned to electrically couple the power device 140A in the power device stack 130A to layers located below the flat heat pipe 120' when installed in the PCB substrate 100.

Figure 9D:
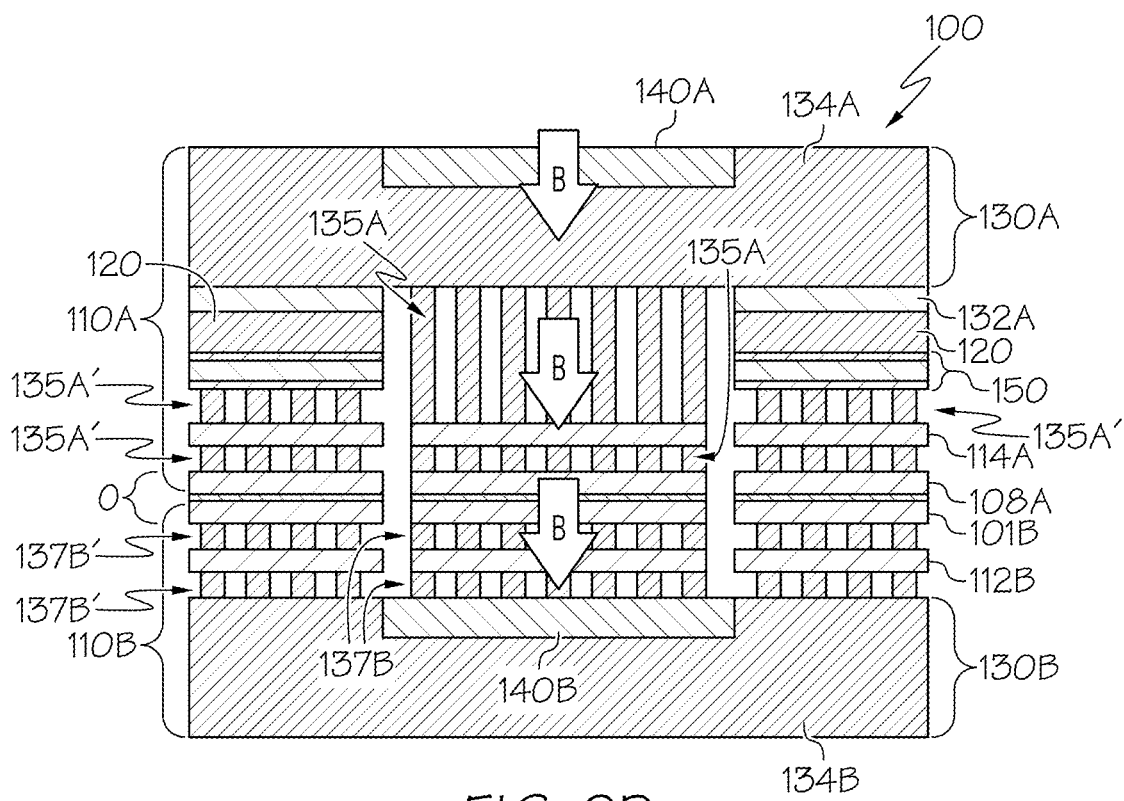
FIG. 9D depicts a cross-sectional view of a PCB substrate implementing the flat heat pipe having a U-shaped evaporator end coupled to the power device stack according to one or more embodiments shown and described herein.

FIG. 9D depicts an illustrative cross-sectional view along the width of the PCB substrate 100. The PCB substrate 100 includes a first power embedded PCB substrate 110A bonded to the second power embedded PCB substrate 110B.

By way of example but without limitation, the first power device stack 130A includes a first power device 140A, a substrate 134A, and an electrical insulation layer 132A. The first power device stack 130A is directly bonded to the U-shaped evaporator end 120'-E of the flat heat pipe 120' which has a smaller width than the first power device stack 130A. The direct bonding provides a thermal coupling between the first power device stack 130A to the flat heat pipe 120'. Electrical vias 135A are positioned in the center portion of the U-shaped evaporator end 120'-E of the flat heat pipe 120'. The vias 135A electrically couple the power device 140A to at least the conductive layer 114A positioned below the flat heat pipe 120'. Arrows "B" depict the flow of electricity from the first power device 140A through the electrical vias 135A to the conductive layer 114A. The first power embedded PCB substrate 110A may further include one or more additional layers below the conductive layer 114A. For example, the conductive layer 114 may further be electrically and thermally coupled to conductive substrate layer 108A through a further set of vias 135A'.

Vias 135A' are coupled to the U-shaped portion of the flat heat pipe 120. Vias 135A' and 137B' pass between and through the conductive substrate layers 114A, 108A, 101B, and 112B of the PCB substrate 100 thereby thermally coupling the second power device stack 130B to the flat heat pipe. Furthermore, with this structure, the electrical current flows straight downwards from the first power device 140A of the first power device stack 130A through vias 135A and 137B and the conductive layers therebetween to the second power device 140B of the second power device stack 130B minimizing inductance and resistance.

The second power embedded PCB substrate 110B includes one or more conductive substrate layers 101B and 112B interposed with pre-preg layers and electrically and thermally coupled through vias 137B and 137B'. The second power embedded PCB substrate 110B further includes a second power device stack 130B having a second power device 140B. The second power embedded PCB substrate 110B is bonded to the first power embedded PCB substrate 110A to form a PCB substrate having at least two power devices 140A and 140B configured in a chip-on-chip vertical configuration. In some embodiments, an N lead frame may be coupled to the first power device 140A, a P lead frame is coupled to the second power device 140B through the substrate 134B and an O lead frame "O" electrically coupled to the first power device 140A through the substrate 134A and the second power device 140B. Such a configuration as shown and described may be implemented to form a half-bridge converter which is a DC-DC type converter.

Turning now to FIG. 10, a cross-sectional view of an illustrative embodiment of an embedded cooling system (e.g., the flat heat pipe and associated components) within a PCB substrate 200 according to one or more embodiments is depicted. The PCB substrate 200 includes a plurality of conductive substrate layers 106A, 101A, 112A, 114A, 103A, 108A, 106B, 101B, 112B, 114B, 103B, and 108B, a plurality of pre-preg layers 105A, 102A, 113A, 104A, 107A, 105B, 102B, 113B, 104B, and 107B, two or more power device stacks 130A and 130B, one or more driver circuit components 155, and a plurality of electrically and/or thermally conductive vias 135A, 135B 137A, 137B interconnecting layers and components therein. As depicted, a first power embedded PCB substrate 110A is bonded to a second power embedded PCB substrate 110B. The first power embedded PCB substrate 110A includes a first power device stack 130A and a flat heat pipe 120 that is bonded to the first power device stack 130A. Each of the power device stacks 130A and 130B include power devices 140A and 140B that may be implemented as a power control component.

The PCB substrate may be a power converter, a power inverter, a power switch, a component thereof or another electrical power device for a controlling the power within a vehicle. The PCB substrate may include an N lead frame, O lead frame, and P lead frame that are electrically coupled to the two or more power devices 140 (e.g., the first power device 140A and the second power device 140B) configured in a chip-on-chip vertical configuration. The N lead frame, which is also referred to as a conductive substrate layer 106A may be electrically coupled to the N power terminal of the first power device 140A, for example through electrically conductive vias 137A. The P lead frame which is also referred to as a conductive layer 108B may be electrically coupled to the P power terminal of the second power device 140B, for example through electrically conductive vias 135B. The O lead frame which may be formed from the conductive substrate layers 108A and 106B is electrically coupled to the first power device 140A and the second power device 140B, respectively through electrical vias 135A' and 137B. In some embodiments, electrical current flows from P lead frame and/or the N lead frame to the respective power devices and out the O lead frame, which serves as an output. The input electrical current, for example, in an inverter configuration, may be DC current and the output may be an alternating current power. In some embodiments, when the inverter is bi-directional, alternating current generated by, for example, regenerative breaking could be received by the O lead frame and provided to the power devices 140 (e.g., the first power device 140A and the second power device 140B) thereby generating DC current for charging batteries for example.

In some embodiments, each of the power devices 140 (e.g., the first power device 140A and the second power device 140B) may be electrically coupled to the one or more driver circuit components 155. The driver circuit components 155 may be laid out on the PCB substrate 200 at a portion adjacent the chip-on-chip power device stack. The one or more driver circuit components 155 may be located on one or both sides of the PCB substrate 200 and electrically coupled through conductive layers and electrical vias to the one or more power devices 140 (e.g., the first power device 140A and the second power device 140B).

As described herein, the embodiments of the present disclosure are directed to chip-on-chip vertically configured power devices 140A and 140B embedded with a PCB substrate 200 and techniques for managing and extracting the heat generated by these devices within the PCB substrate 200. As depicted, the first power device stack 130A is bonded to a flat heat pipe 120. In some instances, the first power device stack 130A includes an electrical insulation layer 132A which electrically isolates the power device stack 130A from the flat heat pipe. The flat heat pipe 120 has an evaporator end and a condenser end, opposite the evaporator end. The first power device stack 130A is bonded to the evaporator end. The flat heat pipe 120 may have a width that is equal, greater, or less than the width of the first power device stack 130A as described hereinabove. In some embodiments, the flat heat pipe 120 may have an evaporator end that is formed in a U-shape. At least the evaporator end of the flat heat pipe 120 is embedded within a pre-preg layer (e.g., pre-preg layer 113) of the PCB substrate 200. However, as shown in FIG. 10, there are instances where all or most of the flat heat pipe 120 may be embedded within the PCB substrate 200.

The first power embedded PCB substrate 110A further includes an electrical isolation layer 150 which may be, for example, a DBC layer. The electrical isolation layer 150 is coupled to the flat heat pipe 120 on the side opposite the first power device stack 130A. The electrical isolation layer 150 is necessary for embodiments where there are one or more vias 135A' formed to provide thermal pathways to and from the flat heat pipe 120 to other electrically active components or conductive layers within the PCB substrate 200. For example, the one or more vias 135A' and 137B along with the conductive layers they are coupled to between the flat heat pipe 120 and the second power device stack 130B provide low thermal resistance thermal pathways therebetween. That is, heat generated by the first power device 140A in the first power device stack 130A may be extracted through its thermal connection to the flat heat pipe 120. Similarly, heat generated by the second power device 140B in the second power device stack 130B may be extracted through its thermal connection to the flat heat pipe 120 via the one or more vias 135A' and 137B and the conductive layers therebetween. The one or more vias 135A' and 137B may be sized to accommodate the heat flux between the second power device stack 130B and the flat heat pipe 120.

In some embodiments, the PCB substrate may include a condenser end 170. The condenser end 170 may include corresponding conductive layers and pre-preg layers that are electrically isolated from the power devices stacks 130A and 130B and the one or more driver circuit components 155. The condenser end 170 of the flat heat pipe 120 may be embedded within the condenser end 170 of the PCB substrate and thermally coupled to a plurality of thermal vias 164A extending outwardly from one side of the flat heat pipe 120 and a plurality of thermal vias 164B extending outwardly from the opposite side of the flat heat pipe 120. In a similar fashion, the plurality of thermal vias 164A and 164B extend inwardly from the top surface (e.g., conductive layer 106A) and the bottom surface (e.g., conductive layer 108B) to the flat heat pipe 120. As used herein the term "inwardly" refers to the direction from outside the PCB substrate (e.g., defined by the conductive layers 106A and 108B) toward a location within the PCB substrate.

The plurality of thermal vias 164A and 164B provide thermal paths to the external cooling devices. For example, cold plates 160A and 160B may be coupled to the top surface (e.g., the N lead frame) and bottom surface (e.g., the P lead frame) of the PCB substrate 200. The cold plates 160A and 160B may be a heat sink or other cooling device such as a vapor chamber, heat exchanger, or the like. Furthermore, external cooling assemblies (e.g., the cold plates 160A and 160B) may comprise active and/or passive cooling systems. Some external cooling assemblies may include heat sinks such as a fin structure or the like. Some external cooling assemblies may be active cooling systems such as a liquid cooled manifold. In some embodiments, the external cooling assemblies may include a plurality of fins past which coolant fluid may flow to draw heat from the plurality of fins. In low power assemblies (e.g., less than about 40 KW, such as about 5 KW to about 10 KW), cold plates 160A and 160B may not be needed. The cold plates 160A and 160B may be coupled via electrical insulation layers 162A and 162B respectively to prevent current flowing through the cold plates 160A and 160B or the plurality of thermal vias 164A and 164B.

The electrical insulation layers 162A and 162B may be grease layers that include, for example, epoxies, silicones, urethanes, acrylates, metals, metal-alloys, or any combination thereof. The electrical insulation layers 162A and 162B may include any electrically insulating, thermally conductive material (e.g., beryllium oxide, aluminum nitride, or the like) or combination of materials. The electrical insulation layers 162A and 162B may be in contact with one or more layers of the external cooling assemblies through a TIM (Thermal Interface Material) layer to ensure contact in some embodiments. In some embodiments, the one or more TIM layers may be electrically insulating to electrically isolate one or more layers of the external cooling assemblies and may in some embodiments form the electrical insulation layers 162A and 162B therebetween.

As previously described herein, the number of external cooling assemblies is not limited by the present disclosure, and a single external cooling assembly may be used to cool any number of flat heat pipes 120 (which are used to cool any number of power devices 140). For example, the external cooling assemblies are thermally coupled to power device stacks 130A and 130B via a corresponding flat heat pipes 120. The power device stacks 130A and 130B with the power devices 140A and 140B thereon may be arranged in a 3×2 array and stacked in a vertical configuration, for example, as depicted and described herein. However, this is merely one illustrative embodiment, and other chip-on-chip stacked arrangements are contemplated and included within the scope of the present disclosure.

Figure 11:
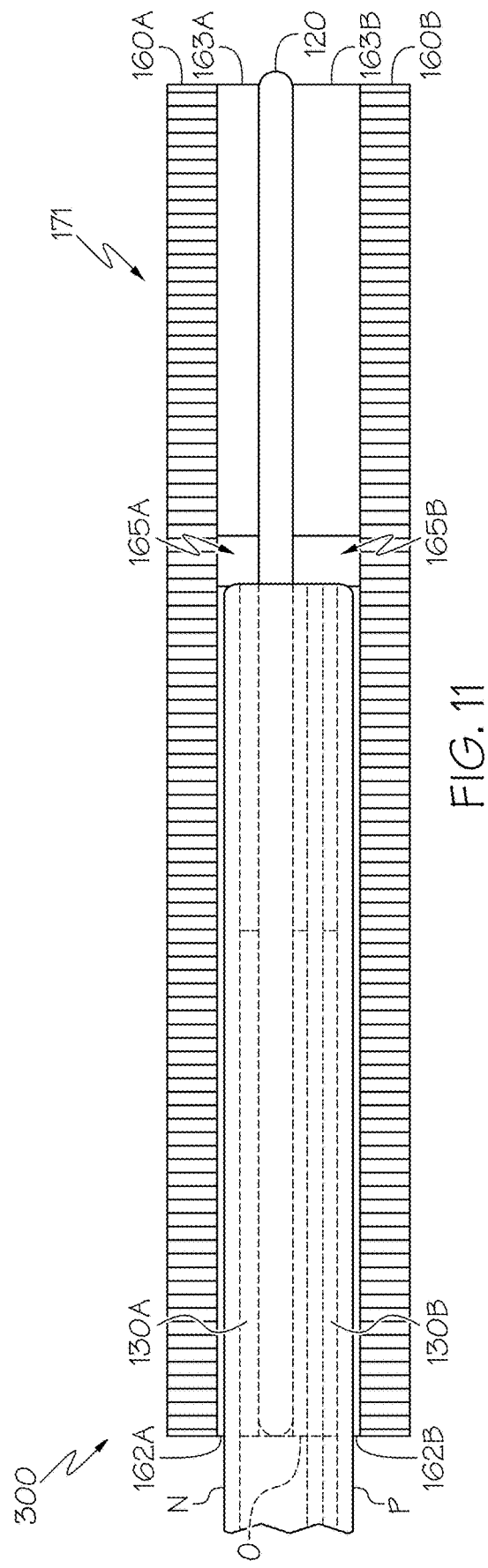
FIG. 11 depicts a cross-sectional view of another illustrative embodiment of an embedded cooling system within a PCB substrate according to one or more embodiments is depicted.

FIG. 11 depicts a cross-sectional view of another embodiment of an embedded cooling system (e.g., the flat heat pipe and associated components) within a PCB substrate 300 according to one or more embodiments is depicted. The PCB substrate 300 depicted in FIG. 11 is similar to the PCB substrate 200 depicted in FIG. 10, however, instead of including a condenser end 170, the flat heat pipe 120 extends out of the PCB substrate 300 and couples to an external cooling assembly 171. As depicted, bulk thermally conductive material 163A and 163B may be coupled to the condenser end of the flat heat pipe 120 that extends out of the PCB substrate 300. The bulk thermally conductive material 163A and 163B may be copper blocks or other bulk thermally conductive material. The bulk thermally conductive material 163A and 163B may be separated by a gap 165A and 165B or other electrically insulating material that is positioned between the PCB substrate 300 and the bulk thermally conductive material 163A and 163B.

Furthermore, the bulk thermally conductive material 163A and 163B is thermally coupled to one or more cold plates 160A and 160B or like external cooling assemblies. The one or more cold plates 160A and 160B or like external cooling assemblies may extend over the top and bottom surfaces of the PCB substrate 300 to provide additional thermal extraction pathways for heat generated within the PCB substrate 300. As described with reference to FIG. 10, electrical insulation layers 162A and 162B may be positioned between the one or more cold plates 160A and 160B or like external cooling assemblies and the top and bottom surfaces of the PCB substrate 300. It should be understood that although bulk thermally conductive material 163A and 163B and cold plates 160A and 160B are depicted on both the top and bottom of the PCB substrate 300 and the flat heat pipe 120, this is merely an example. In some embodiments, external cooling assemblies 171 may be coupled to only the top or the bottom of the PCB substrate 300 and/or the flat heat pipe 120.

Figure 12D:
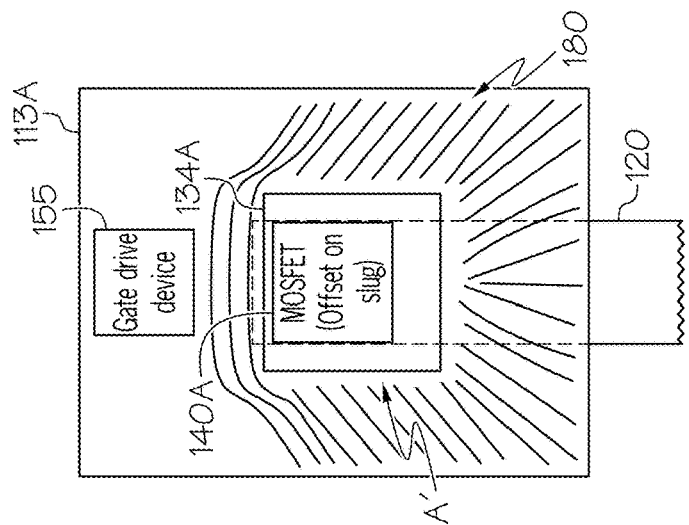
FIG. 12D depicts a layer of the PCB substrate implementing a trace pattern for guiding heat toward a flat heat pipe according to one or more embodiments is depicted.
Figure 12C:
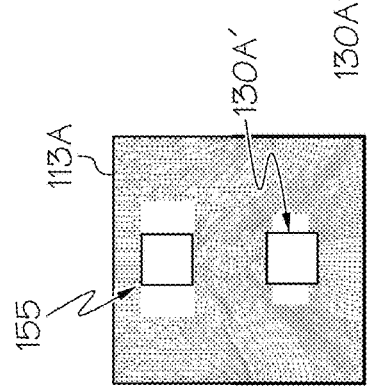
FIG. 12C depicts a heat flow map of a layer of the PCB substrate having the power device stack according to one or more embodiments is depicted.

In addition to embedding a flat heat pipe 120 within the PCB substrate to provide for the removal of heat between power devices embedded therein in a chip-on-chip vertically stacked configuration, traces 180 within and on the pre-preg layers may be designed and further configured to guide heat to particular portions of the PCB substrate. Turning to FIGS. 12A-12D a series of illustrations are shown depicting the application of heat focused trace patterns within and on the pre-preg layers within the PCB substrate. It is known that traces, such as copper traces can be formed within and on pre-preg layers within PCB substrates to electrically interconnect components. However, it has been determined that by analyzing the locations at which heat is generated and identifying locations where heat is extracted from a PCB substrate, particular trace patterns may be implemented to thermally interconnect and/or provide low thermal resistance pathways therebetween. FIG. 12A depicts a top view of a typical power device stack 130A having a substrate 134A and a power device 140A. The power device 140A is generally positioned in the center of the substrate 134A. This provides uniform heat flow from the power device 140A outward through the substrate 134A and into the PCB substrate and thermally connected pathways such as vias and/or cooling devices such as a flat heat pipe 120.

Figure 12B:
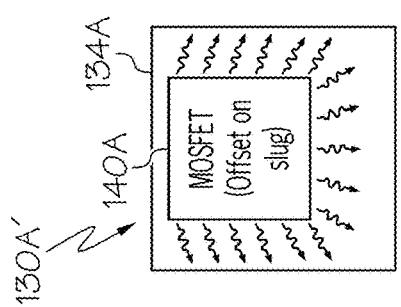
FIG. 12B depicts a top view of a power device stack having a substrate and a power device that is offset within the substrate according to one or more embodiments is depicted.
Figure 12A:
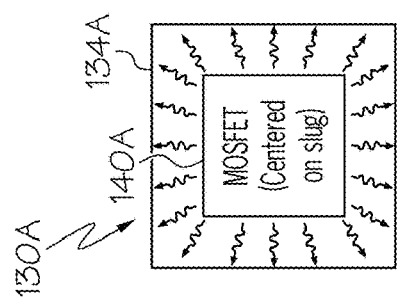
FIG. 12A depicts a top view of a typical power device stack having a substrate and a power device according to one or more embodiments is depicted.

However, by offsetting the power device 140A in the substrate 134A (e.g., a copper slug), the substrate 134A can provide a more directed flow of heat from the power device 140A by utilizing the substrate material as depicted in FIG. 12B. Through an analysis of the heat flow within a pre-preg layer (e.g., pre-preg layer 113) of the PCB substrate as shown in FIG. 12C, a heat flow map can be determined. As depicted, driver circuit components 155 are located adjacent the power device stack 130A'. The driver circuit components 155 typically generate low to no heat with respect to the heat generated by the power device 140A. Accordingly, the flat heat pipe 120 is typically directly connected to the power device stack 130A' and not the 130A'. Furthermore, the flat heat pipe 120 is positioned to extend in a direction away from the power device stack 130A' as depicted in FIG. 12D and other embodiments described herein. Therefore, to improve the utilization of the flat heat pipe 120 it is advantageous to direct as much of the radiating heat from the power device stack 130A' (or the power device stack 130A where the power device 140A is generally centered in the substrate 134A) toward the flat heat pipe 120. Accordingly, in some embodiments, traces 180 may be designed and formed within and on the pre-preg layers (e.g., pre-preg layer 113A) of the PCB substrate in a pattern that guides heat toward and/or in the direction of the flat heat pipe 120. The traces 180 may be made of any thermally conductive material, for example, copper, silver, brass, aluminum, gold, or the like. The traces 180 may be made of the same of different material as the electrically conductive traces and vias implemented within the PCB substrate.

It is noted that although the above is described with reference to the first power device stack 130A being coupled to the flat heat pipe 120, the same may apply to the second power device stack being configured to be coupled to a flat heat pipe 120 as well. Furthermore, the traces described with reference to FIGS. 12A-12D may be implement with the second power device 140B and the second power device stack 130B.

It should now be understood that the embedded cooling systems described herein include power devices (e.g., embedded power semiconductor devices) and heat pipes, such as flat heat pipes embedded within substrates such as gate driver printed circuit boards (PCBs). The embedded power devices shown and described herein utilize copper layers and/or insulation layers to form an inverter topology, a convertor topology, or a similar topology. One or more of the copper layers are formed to receive the embedded flat heat pipes, which are configured to extend from the copper layer(s) to a location outside of the substrate, the location having a cooling assembly that facilitates heat transfer from the power devices out of the PCBs.

More specifically, the printed circuit board (PCB) substrate includes at least one pre-preg layer interposed between one or more electrically conductive layers, and at least two power device stacks each having a power device embedded within the PCB substrate in a vertical stack configuration. A flat heat pipe is positioned between the at least two power device stacks within the at least one pre-preg layer. The flat heat pipe is directly bonded to a first one of the at least two power device stacks on one surface of the flat heat pipe and thermally coupled to a second one of the at least two power device stacks on an opposite surface of the flat heat pipe.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A printed circuit board (PCB) substrate, comprising:
   at least one pre-preg layer interposed between one or more electrically conductive layers;
   power device stacks, each having a power device embedded within the PCB substrate in a vertical stack configuration; and
   a flat heat pipe positioned between the power device stacks within the at least one pre-preg layer, one surface of the flat heat pipe directly bonded to a first one of the power device stacks and an opposite surface of the flat heat pipe thermally coupled to a second one of the power device stacks.

2. The PCB substrate of claim 1, wherein the second one of the power device stacks is thermally coupled to the flat heat pipe through a plurality of vias.

3. The PCB substrate of claim 1, wherein the first one of the power device stacks comprises an electrical insulation layer, the power device, and a substrate configured to receive the power device, wherein the substrate is bonded to the flat heat pipe via the electrical insulation layer.

4. The PCB substrate of claim 3, wherein the substrate is formed from copper, aluminum, gold, silver, or an alloy thereof.

5. The PCB substrate of claim 3, wherein the electrical insulation layer is a ceramic dielectric layer or an insulated metal substrate (IMS) dielectric layer.

6. The PCB substrate of claim 3, wherein the at least one pre-preg layer comprises thermally conductive traces configured in a heat guide pattern such that heat generated by the power device is directed away from the substrate and in a direction of the flat heat pipe.

7. The PCB substrate of claim 1, wherein the flat heat pipe comprises an evaporator end and a condenser end spaced a distance apart from the evaporator end, the evaporator end is U-shaped.

8. The PCB substrate of claim 7, wherein a plurality of electrical vias extend from the first one of the power device stacks through a center portion of the U-shaped evaporator end thereby electrically coupling the first one of the power device stacks to the second one of the power device stacks.

9. The PCB substrate of claim 1, wherein the flat heat pipe has a width less than a width of the first one of the power device stacks.

10. The PCB substrate of claim 9, wherein a plurality of electrical vias extend from the first one of the power device stacks along portions adjacent the width of the flat heat pipe thereby electrically coupling the first one of the power device stacks to the second one of the power device stacks.

11. The PCB substrate of claim 1, wherein the one or more electrically conductive layers of the PCB substrate include an N lead frame, a P lead frame, and an O lead frame, wherein:
the N lead frame is electrically coupled to the power device of the first one of the power device stacks,
the P lead frame is electrically coupled to the power device of the second one of the power device stacks,
the O lead frame is electrically coupled to the power devices of the first one and the second one of the power device stacks, and
the O lead frame being positioned between the flat heat pipe and the second one of the power device stacks.

12. The PCB substrate of claim 1, wherein the flat heat pipe comprises a first end and a second end spaced a distance apart from the first end, the first end embedded within the at least one pre-preg layer of the PCB substrate and the second end extending outside of the PCB substrate.

13. The PCB substrate of claim 12, further comprising a cooling assembly arranged externally to the PCB substrate, wherein the second end of the flat heat pipe is at least partially disposed within the cooling assembly.

14. The PCB substrate of claim 13, wherein the cooling assembly further comprises:
a bulk thermally conductive material disposed on a surface of the flat heat pipe; and
a cold plate disposed on the bulk thermally conductive material.

15. The PCB substrate of claim 1, wherein the flat heat pipe comprises:
an enclosed tube having a porous layer disposed on an interior surface of the enclosed tube, and
a liquid disposed within the enclosed tube, wherein heat, generated by the power device, vaporizes the liquid within the flat heat pipe at a first end and the vaporized liquid condenses back to a liquid phase at a second end of the flat heat pipe.

16. The PCB substrate of claim 1, further comprising a plurality of power device stacks arranged in a planar array.

17. The PCB substrate of claim 1, wherein a power module comprising the PCB substrate and the power device has a power rating greater than or equal to 40 kilowatts (kW).

18. An embedded cooling system, comprising:
a printed circuit board (PCB) substrate having electrically conductive layers and at least one pre-preg layer interposed between the electrically conductive layers;
power device stacks, each having a power device embedded within the PCB substrate in a vertical stack configuration;
a flat heat pipe having an evaporator end and a condenser end opposite the evaporator end, the evaporator end positioned between the power device stacks within the at least one pre-preg layer, a top surface of the evaporator end directly bonded to a first one of the power device stacks and thermally coupled to a second one of the power device stacks on a bottom surface of the evaporator end of the flat heat pipe;
a thermally conductive via comprising a first end and a second end opposite the first end, the first end extending from a surface of the PCB substrate to the condenser end of the flat heat pipe and coupled to the flat heat pipe; and
a cold plate thermally coupled to the second end of the thermally conductive via.

19. The embedded cooling system of claim 18, wherein the evaporator end and the condenser end of the flat heat pipe are embedded within the PCB substrate.

20. The embedded cooling system of claim 18, wherein:
the condenser end of the flat heat pipe extends out of the PCB substrate, and
the thermally conductive via is a bulk thermally conductive material thermally coupled to the condenser end of the flat heat pipe.

* * * * *